United States Patent
Kim et al.

(10) Patent No.: US 9,672,885 B2
(45) Date of Patent: Jun. 6, 2017

(54) MRAM WORD LINE POWER CONTROL SCHEME

(75) Inventors: Sungryul Kim, San Diego, CA (US); Jung Pill Kim, San Diego, CA (US); Taehyun Kim, San Diego, CA (US); Seung H. Kang, San Diego, CA (US); Matthew M. Nowak, San Diego, CA (US); Manoj Bhatnagar, San Carlos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 275 days.

(21) Appl. No.: 13/602,829

(22) Filed: Sep. 4, 2012

(65) Prior Publication Data

US 2014/0063922 A1 Mar. 6, 2014

(51) Int. Cl.
*G11C 11/16* (2006.01)
*G11C 8/08* (2006.01)

(52) U.S. Cl.
CPC .............. *G11C 11/165* (2013.01); *G11C 8/08* (2013.01); *G11C 11/16* (2013.01)

(58) Field of Classification Search
CPC ......... G11C 8/08; G11C 11/16; G11C 11/165; G11C 11/1697
USPC ................. 365/158, 189.09, 226, 230.06
See application file for complete search history.

(56) References Cited

U.S. PATENT DOCUMENTS

| | | | |
|---|---|---|---|
| 7,564,725 B2 | 7/2009 | Houston | |
| 7,619,947 B2 | 11/2009 | Houston | |
| 7,742,329 B2 | 6/2010 | Yoon et al. | |
| 7,760,576 B2 | 7/2010 | Mohammad | |
| 7,817,490 B1 | 10/2010 | Sridhara | |
| 2007/0047365 A1* | 3/2007 | Yoshinaga et al. | 365/226 |
| 2008/0056057 A1* | 3/2008 | Kim | G11C 7/1057 365/233.1 |
| 2009/0026882 A1 | 1/2009 | Steeneken et al. | |
| 2009/0109785 A1 | 4/2009 | Houston et al. | |
| 2009/0180315 A1 | 7/2009 | Yoon et al. | |
| 2009/0267882 A1* | 10/2009 | Kim et al. | 345/92 |
| 2010/0110767 A1 | 5/2010 | Katoh et al. | |
| 2010/0246298 A1 | 9/2010 | Zhang et al. | |
| 2014/0063922 A1* | 3/2014 | Kim et al. | 365/158 |

FOREIGN PATENT DOCUMENTS

| | | |
|---|---|---|
| CN | 101636792 A | 1/2010 |
| WO | 2009062072 A1 | 5/2009 |

OTHER PUBLICATIONS

International Search Report and Written Opinion—PCT/US2013/058081—ISA/EPO—Nov. 22, 2013.

(Continued)

*Primary Examiner* — Douglas King

(74) *Attorney, Agent, or Firm* — Qualcomm Incorporated

(57) ABSTRACT

Systems, circuits and methods for controlling word line (WL) power levels at a WL of a Magnetoresistive Random Access Memory (MRAM). The disclosed power control scheme uses existing read/write commands and an existing power generation module associated with the MRAM to supply and control WL power levels, thereby eliminating the cost and increased die-size of schemes that control WL power through relatively large and expensive power control switches and control circuitry on the MRAM macro.

15 Claims, 5 Drawing Sheets

(56) References Cited

OTHER PUBLICATIONS

Singh A.K, et al., "Mitigation of Intra-Array SRAM Variability using Adaptive Voltage Architecture", ICCAD '09: Proceedings of the 2009 International Conference on Computer-Aided Design, 2009, 8pgs.

* cited by examiner

MRAM WORD LINE POWER CONTROL SCHEME

FIELD OF DISCLOSURE

The present disclosure relates in general to power control techniques for electronic circuits. More specifically, the present disclosure relates to systems, circuits and methods for controlling the word line power provided to Magnetoresistive Random Access Memory (MRAM).

BACKGROUND

Computing devices (e.g., desktop and portable computers, mobile phones, PDAs, tablets and the like) have become increasingly powerful with increasing needs for memory capabilities. Memory can be classified as either volatile or non-volatile. Volatile memory requires constant power to maintain stored information. The most common type of memory found in computers is volatile Random Access Memory (RAM). Important features of volatile RAM include fast read/write speeds and easy re-write capability. To store information on conventional volatile RAM requires electricity flowing through the RAM. When system power is switched off, any information not copied to a hard drive is lost.

By contrast, non-volatile memory does not require a constant power supply. Thus, even when system power is off, the stored information in non-volatile memory is retained. Examples of non-volatile memory include non-volatile RAM and non-volatile Read Only Memory (ROM). Flash memory is a common type of ROM often used in thumb drives and MP3 players. Although non-volatile memories have the advantage of maintaining content without having power applied, they in general have lower read/write speeds and a relatively limited lifetime in comparison to volatile memories.

An emerging type of non-volatile memory is Magnetoresistive Random Access Memory (MRAM). MRAM combines a magnetic device with standard silicon-based microelectronics to obtain the combined attributes of non-volatility, high-speed read/write operations, unlimited read/write endurance and data retention, and low cell leakage. Unlike other types of RAM, data in MRAM is stored as magnetic storage elements instead of electric charges. Each MRAM cell includes a transistor, a Magnetic Tunnel Junction (MTJ) device for data storage, a bit line, a digit line and a word line. Data is read as the resistance of the MTJ tunnel junctions. Using a magnetic state for storage has two main benefits. First, the magnetic polarization does not leak away with time like charge does, so the information is stored even when system power is turned off. Second, switching the magnetic polarization between the two states has no known wear-out mechanism.

The MTJ of a conventional MRAM includes a fixed magnetic layer, a thin dielectric tunnel barrier and a free magnetic layer. The MTJ has a low resistance when the magnetic moment of the free layer is parallel to the fixed, layer, and a high resistance when the free layer moment is oriented anti-parallel to the fixed layer moment. This change in resistance with the magnetic state of the device is an effect known as magnetoresistance, hence the name "Magnetoresistive" RAM. The MRAM can be read by measuring the electrical resistance of the MTJ. For example, a particular MTJ can be selected for a read operation by activating its associated word line transistor, which switches current from a bit line through the MTJ. Due to the tunnel magnetoresistive effect, the electrical resistance of the MTJ changes based on the orientation of the polarities in the two magnetic layers. The resistance inside any particular MTJ can be determined from the current resulting from the polarity of the free layer. Conventionally, if the fixed layer and free layer have the same polarity, the resistance is low and a "0" is read. If the fixed layer and free layer have opposite polarity, the resistance is higher and a "1" is read. The write operation of a conventional MRAM is a magnetic operation. Accordingly, the word line transistor is off during the write operation. Current is propagated through the bit line and digit line to establish magnetic fields that can affect the polarity of the free layer of the MTJ and consequently the logic state of the MRAM.

Unlike conventional MRAM, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM). During the write operation, the spin-polarized electrons exert a torque on the free layer, which can switch the polarity of the free layer. The read operation is similar to conventional MRAM in that a current is used to detect the resistance/logic state of the MTJ storage element, as previously described. For a typical STT-MRAM, the ceil includes an MTJ, a transistor, a bit line and a word line. The word line is coupled to the transistor gate to switch the transistor on for both read and write operations, thereby allowing current to flow through the MTJ so a logic state can be read or written. Read/write circuitry generates a write voltage between the bit line and the source line. Depending on the polarity of the voltage between the bit line and the source line, the polarity of the free layer of the MTJ can be changed and correspondingly a logic state can be written to the MRAM cell. Likewise, during a read operation, a read current is generated, which flows between the bit line and the source line through the MTJ. When the word line transistor is activated, to permit current to flow, the resistance (logic state) of the MTJ can be determined based on the voltage differential between the bit line and the source line.

The electrical write operation of STT-MRAM eliminates the scaling problem due to the magnetic write operation in MRAM. Further, the circuit design is less complicated for STT-MRAM. However, fluctuations in the core operating voltage Vdd can cause cell read current to approach or be higher than the write current threshold, and thus cause an invalid write operation and/or potential damage to system components. Inversely, fluctuations in Vdd can drive the operating voltage down to an undesirably low level that can decrease system performance and potentially prevent the system from functioning properly or at all. These and other problems are addressed by the following issued U.S. patents and published patent application, which are owned by the assignee of the present disclosure: U.S. Pat. Nos. 7,742,329; 8,107,280; 8,004,880; 8,027,206; 8,159,864; and published U.S. Patent Application No. 2009-G1G3354-A1. The above-described patents and published patent application are incorporated herein by reference in their entirety.

In particular, U.S. Pat. No. 7,742,329 (the '329 patent) addresses the problem of invalid read/write operations due to confusing a read voltage applied to the word line with a write voltage applied to the word line. The '329 patent addresses this issue by having a first voltage supplied to the word line transistor for write operations, and a second voltage, which is less than the first voltage, supplied to the word line transistor during read operations.

Important design goals for integrated circuits include reducing the number, size and cost of the elements used to perform a given task. Performing tasks with fewer and less expensive elements decreases cost and reduces the die-size of the integrated circuit. Accordingly, it is desirable to provide circuits, systems and methods that provide different power levels to a word line of an MRAM while optimizing the size and cost of the MRAM cell.

SUMMARY

Exemplary embodiments of the invention are directed to systems, circuits and methods for controlling the word line power applied to word line transistors in Magnetoresistive Random Access Memory (MRAM).

An embodiment of the invention can include a memory module comprising Magnetoresistive Random Access Memory (MRAM), along with a power generation module comprising a selector configured to provide different power levels to a word line of the MRAM in response to at least one of a write command or a read command.

In another embodiment of the invention, the write command causes the selector to provide a first power level to the MRAM, and the read command causes the selector to provide a second power level to the MRAM. The first power level may be higher than the second power level.

In another embodiment of the invention, the power generation module may be implemented as a low dropout (LDO) regulator, and the selector may be implemented as a multiplexer, wherein the multiplexer selects the first power level in response to the write command, and wherein the multiplexer selects the second power level in response to the read command.

Another embodiment of the invention can include a method of controlling word line power to an MRAM comprising the steps of coupling read commands and write commands to a power generation module, and controlling a selector of the power generation module to provide different power levels to a word line of the MRAM in response to at least one of the read command or the write command.

In a further embodiment of the invention, the write command causes the selector to provide a first power level to the MRAM, and the read command causes the selector to provide a second power level to the MRAM. The first power level may be higher than the second power level.

In a further embodiment of the invention, the power generation module may be implemented as a low dropout (LDO) regulator, and the selector may be implemented as a multiplexer, wherein the multiplexer selects the first power level in response to the write command, and wherein the multiplexer selects the second power level in response to the read command.

Another embodiment of the invention can include an apparatus having means for storing data, means for generating power, and means for providing different power levels to a word line of the means for storing data in response to at least one of a write command or a read command.

In a further embodiment of the invention, the write command causes the means for providing different power levels to provide a first power level to the word line, and the read command causes the means for providing different power levels to provide a second power level to the word line. The first power level may be higher than the second power level.

In another embodiment of the invention, the means for storing data may be implemented as an MRAM, the means for generating power may be implemented as a low dropout (LDO) regulator, and the means for providing different power levels may be implemented as means for selecting a first power level and means for selecting a second power level. The means for selecting a first power level and means for selecting a second power level may be implemented as a multiplexer, wherein the multiplexer selects the first power level in response to the write command, and wherein the multiplexer selects the second power level in response to the read command.

Another embodiment of the invention can include a method having step for storing data, step for generating power, and step for providing different power levels to a word line of the step for storing data in response to at least one of a write command or a read command.

In a further embodiment of the invention, the write command causes the step for providing different power levels to provide a first power level to the word line, and the read command causes the step for providing different power levels to provide a second power level to the word line. The first power level may be higher than the second power level.

In a further embodiment of the invention, the step for storing data may be implemented by storing data in an MRAM, the step for generating power may be implemented by generating power via a low dropout (LDO) regulator, and the step for providing different power levels may be implemented as step for selecting a first power level and step for selecting a second power level. The step for selecting a first power level and step for selecting a second power level may be implemented by providing a multiplexer, wherein the multiplexer selects the first power level in response to the write command, and wherein the multiplexer selects the second power level in response to the read command.

The embodiments may be integrated in at least one semiconductor die.

The medium of the embodiments may include a device, selected from the group consisting of a set top box, music player, video player, entertainment unit, navigation device, communications device, personal digital assistant (FDA), fixed location data unit, and a computer, into which the embodiments may be integrated.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Figure 3:
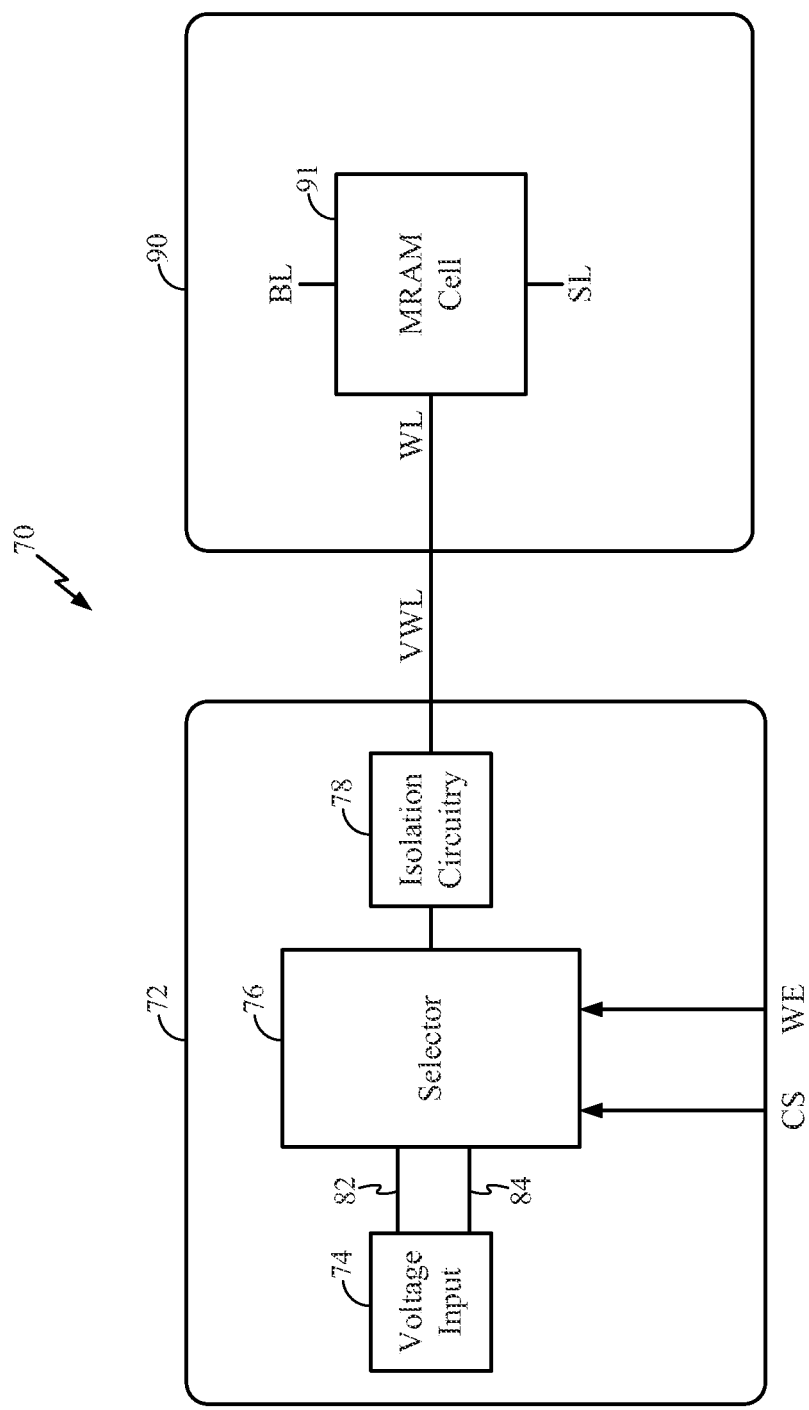
FIG. 3 is a simplified schematic diagram of an MRAM word line power control scheme of the disclosed embodiment.
Figure 4:
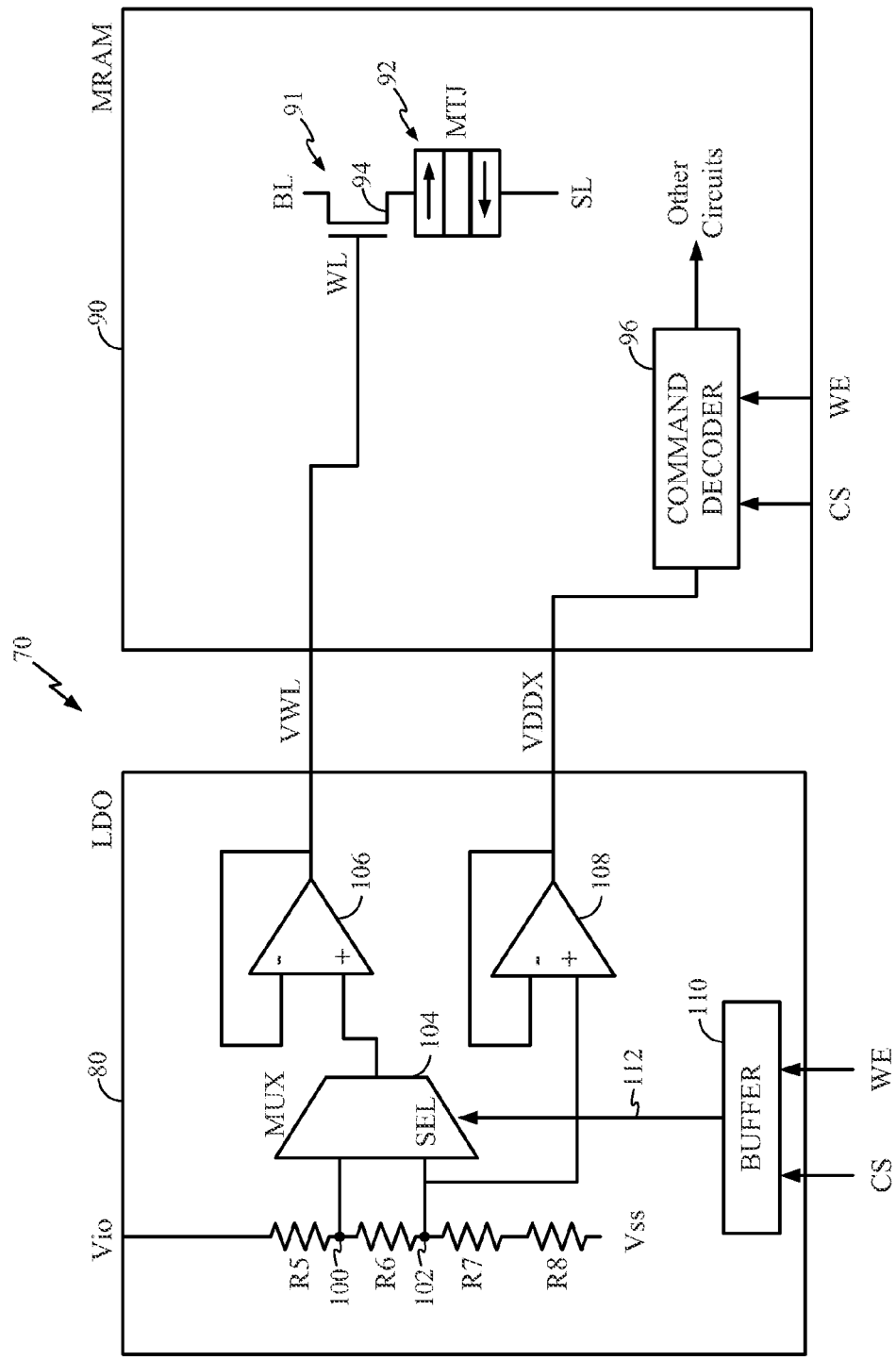
FIG. 4 is a simplified schematic diagram showing a more detailed example of the embodiment of FIG. 3.
Figure 5:
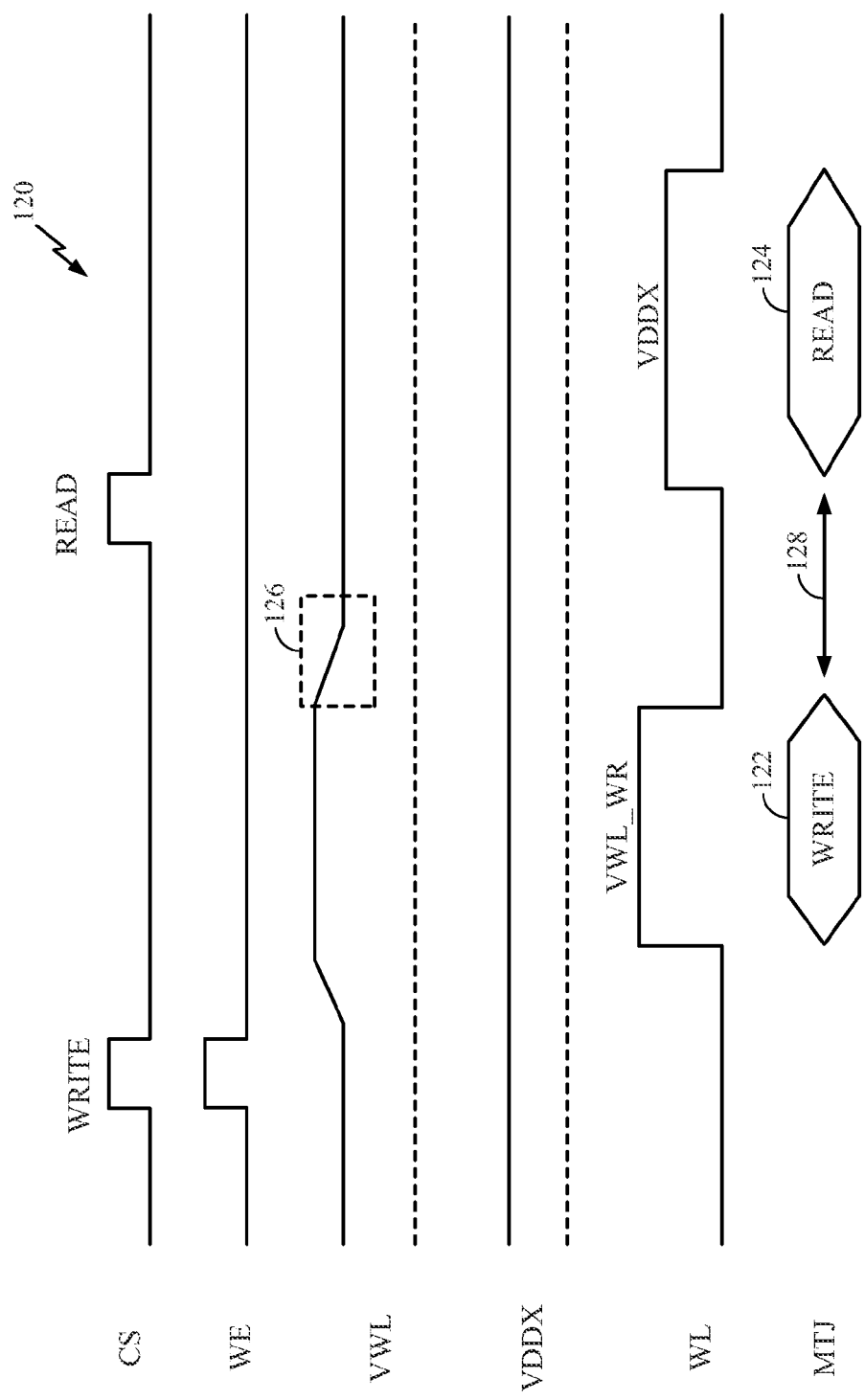
FIG. 5 is a timing diagram illustrating the power control scheme of FIGS. 3 and 4.

The Integrated Circuits (IC) described herein may be implemented in a variety of applications including mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIGS. 3-5 illustrate IC's according to the teachings of the disclosure, the disclosure is not limited to these exemplary illustrated units. Embodiments of the disclosure may be suitably employed in any device which includes active integrated circuitry including memory and on-chip circuitry for test and characterization.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described herein.

The present disclosure uses the term MRAM to describe the memory cells of the disclosed embodiments. The general term MRAM is meant to include any type of MRAM capable of using the disclosed word line power scheme, including but not limited to conventional MRAM, Spin Transfer Torque Magnetoresistive Random Access Memory (STT-MRAM), Spin Transfer Torque RAM (STT-RAM), Spin Torque Transfer Magnetization Switching RAM (Spin-RAM), and Spin Momentum Transfer (SMT-RAM).

The embodiments of the present disclosure include an integrated circuit (IC) power generation module, which may be implemented as a low dropout (LDO) voltage regulator. The IC of the disclosed embodiments also includes an MRAM macro. However, the features and operation of the disclosed embodiments apply equally to a stand-alone MRAM device having an internal power generator. Accordingly, all descriptions herein of the operation of the disclosed MRAM macro apply equally to an implementation wherein the MRAM macro is instead a stand-alone MRAM device. Similarly, all descriptions herein of the operation of the disclosed power generation module and LDO apply equally to an implementation wherein the power generation module is an internal power generator.

Turning now to an overview of the relevant operating environment, the disclosed embodiments function as part of a conventional IC having a variety of on-chip blocks including memory macros. Conventional memory is made of various electronic components (e.g., transistors and capacitors) that are paired to create a memory cell, which represents one bit of data (0 or 1). Memory cells are aligned in columns and rows, the intersections of which are the virtual cell addresses at which information is stored. Reading and writing information occurs by measuring or changing an electronic value at a specific memory cell address.

If the IC memory macro comprises MRAM, power must be provided to the word line transistor of a selected MRAM cell in order to read data from, or write data to, the selected MRAM cell. However, because read operations and write operations are both performed by passing current through the MRAM's MTJ, there is a potential for read operations to disturb the data stored in the MTJ. For example, if the read current is similar to or greater in magnitude than the write current threshold, there is a substantial chance the read operation may disturb the logic state of the MTJ, thereby degrade the integrity of the memory. Previously described U.S. Pat. No. 7,742,329 (the '329 patent) addresses this problem by providing MRAM circuitry and controls that supply a first voltage to the word line transistor for a write operation, along with a second voltage, which is less than the first voltage, supplied to the word line transistor during a read operation. More specifically, the '329 patent provides Word line Driver circuitry 432 shown in FIGS. 4A, 4B, 7 and 8. The WL Driver 432 shown in FIG. 7 of the '329 patent includes selection logic 710, along with controlled switching devices 720, 730 configured to select a first voltage, Vpp, for performing a write operations In response to a write enable signal, wr_en, and to select a second voltage, Vdd, for performing a read, operation in response to a read enable signal, rd_en.

The embodiments of the present disclosure include circuits, systems and methods for providing different power levels to the word line of an MRAM macro while also optimizing the size and cost of the MRAM cell. External read/write commands control and instruct an existing IC power generation module to provide a first power level to the word line during a read operation, and to provide a second power level, which is different from the first power level, to the word line during a write operation. The existing power generation module of the disclosed embodiment may be implemented as the IC's low drop out (LDO) voltage regulator. Because a conventional LDO typically includes a feature that allows its output power level to be changed according to a trimming code, the LDO of the disclosed embodiment can be inexpensively implemented by configuring the LDO to change its word line power level according to the external read/write commands. Using the parameters described in the present disclosure, one of ordinary skill in the relevant arts may implement the LDO configurations described herein directly in hardware, in a software module executed by a processor, or in any combination thereof. In conventional IC technology, LDO's provide stable voltage references for on-chip blocks such as digital, analog, and RF. An ideal LDO inputs an unregulated voltage from a voltage source, and provides a constant output voltage substantially free of noise or spurs. One figure of merit for an LDO is the dropout voltage. The dropout voltage is the minimum voltage across the regulator required to maintain the output voltage at the correct level. A lower dropout voltage requires less supply voltage and results in less power dissipated internally within the regulator.

Thus, under the disclosed embodiment, the different word line power levels required for read/write operations are accomplished using existing external command signals and an existing power generation module, thereby eliminating the cost and die-size required to supply the different word line power levels via switching circuitry on the MRAM macro. An example of a known switch-based, word line power control scheme is described, below in connection with FIGS. 1 and 2.

Figure 1:
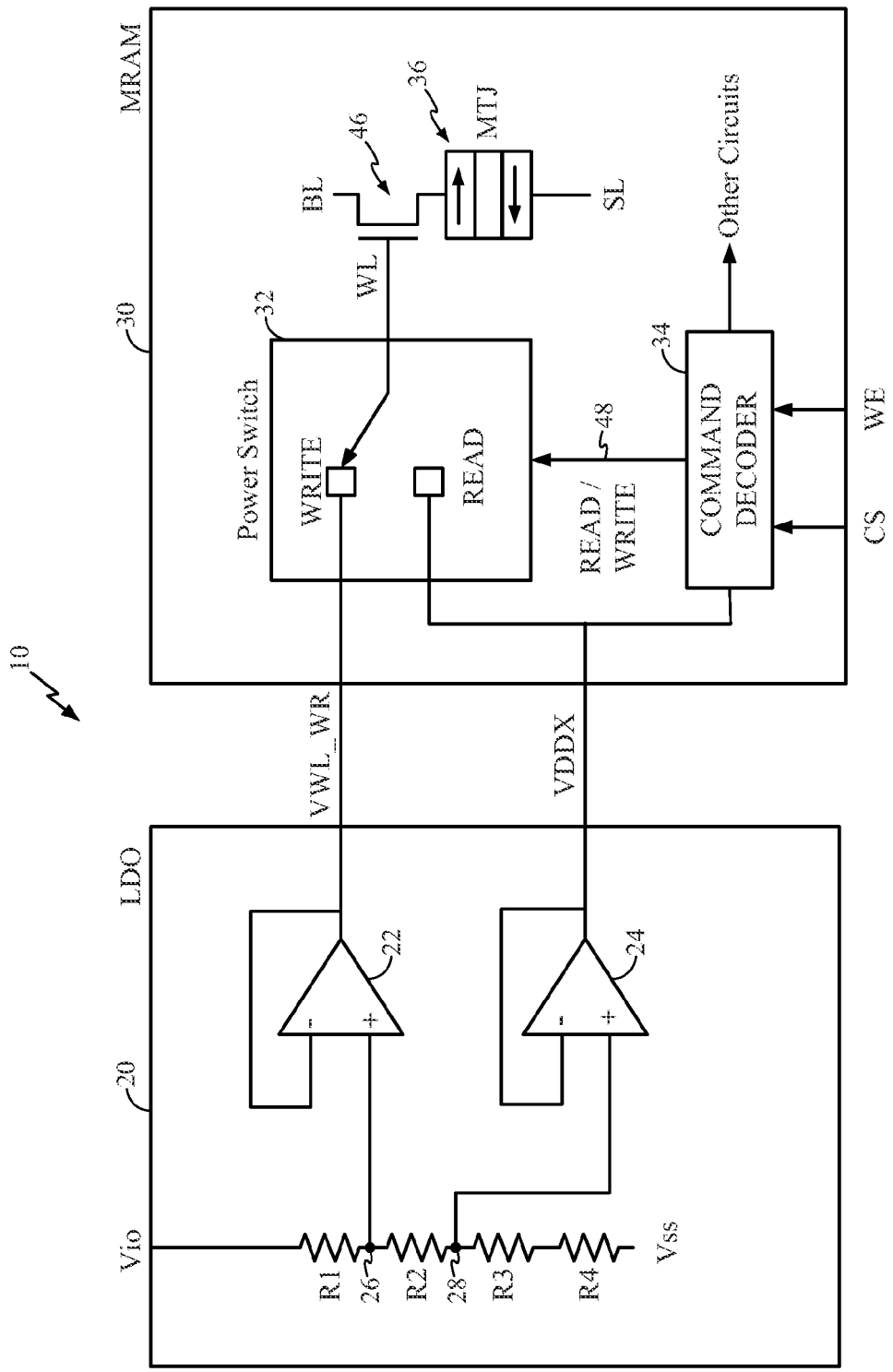
FIG. 1 is a simplified schematic diagram of a known MRAM word line power control scheme.
Figure 2:
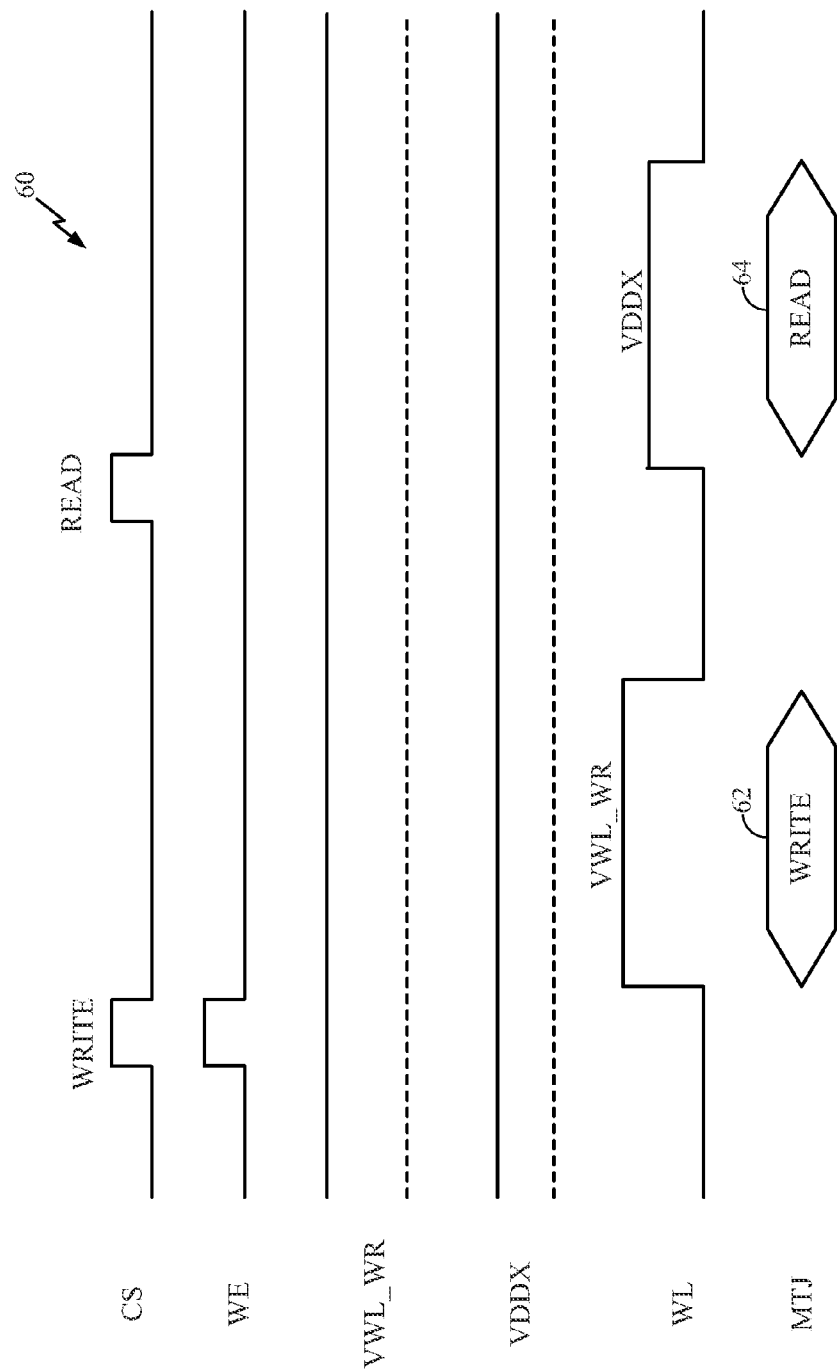
FIG. 2 is a timing diagram illustrating the power control scheme of FIG. 1.

FIG. 1 is a simplified schematic diagram of an IC having a known MRAM word line power control scheme. FIG. 2 is a timing diagram illustrating the operation of the power control scheme of FIG. 1. As shown in FIG. 1, an integrated circuit (IC) 10 includes a low dropout (LDO) 20 and a Magnetoresistive Random Access Memory (MRAM) 30. LDO 20 provides stable output voltages (e.g., word line write voltage—VWL_WR; and core power supply voltage—VDDX) to MRAM 30 with as low a difference as possible between the voltage levels into LDO 20 and the voltage levels out of LDO 20 (i.e., "low dropout"). LDO 20 includes voltage divider circuitry formed by resistive elements R1, R2, R3 and R4 coupled to voltage follower circuitry formed by operational amplifiers 22, 24. Voltage divider circuitry R1-R4 produces two voltages, VWL_WR and VDDX, that are each a fraction of the difference between the input voltage (Vio) and the negative supply or ground voltage (Vss). VWL_WR is produced at a first node 26 of voltage divider circuitry R1-R4, and VDDX is produced at a second node 28 of voltage divider circuitry R1-R4. Operational amplifier 22 receives VWL_WR as an input voltage at its positive (+) terminal, and operational amplifier 24 receives VDDX as an input voltage at its positive (+) terminal. The output voltages from operational amplifiers 22, 24 are substantially equal to the voltages at the positive input terminals of each operational amplifier, respectively. Thus, operational amplifiers 22, 24 are each configured as voltage followers that isolate their respective output signals, VWL_WR and VDDX, from the voltages received at their positive (+) input terminals, thereby drawing very little power from their signal sources and avoiding "loading" effects.

Continuing with the simplified schematic diagram of FIG. 1, MRAM 30 includes power switch circuitry 32, command decoder circuitry 34, an MTJ 36, a transistor 46, a bit line (BL), a word line (WL) and a source line (SL). MRAM 30 receives the stable and isolated VWL_WR and VDDX power signals as inputs to power switch circuitry 32. VDDX serves the dual function of providing a power level for the read operation, as well as being the core power signal of the memory macro. Accordingly, VDDX is also provided to command decoder circuitry 34 (and other components of IC 10—not shown). Command decoder circuitry 34 generates read/write commands 48 in response to control signals (CS) and write enable (WE) signals into command decoder circuitry 34. Power switch circuitry 32 receives read/write commands 48 from command decoder circuitry 34.

FIG. 2 is a timing diagram 60 illustrating the operation of the known word line power control scheme shown in FIG. 1. In particular, timing diagram 60 shows the behavior of MTJ 36 and certain signals (CS, WE, VWL_WR, VDDX, WL) during write and read operations. The horizontal axis of timing diagram 60 represents time, and the vertical axis of timing diagram 60 represents power levels of the signals listed on the left side of the diagram. The word line power levels VWL_WR and VDDX may be actively driven at some times and not actively driven at other times. When a signal is actively driven, the signal is depicted as a solid line. When a signal is not being actively driven, it may be pulled high or low by a resistor, or may be allowed to float. Whenever a signal is not actively driven, the timing diagram depicts it as a dashed line. If the dashed line is high or low, it may be assumed that a pull up or pull down resistor is maintaining the state of that signal.

Referring now to both the timing diagram of FIG. 2 and the simplified schematic diagram of FIG. 1, the read/write operation of MRAM 30 is enabled by command signals CS and WE. A negative/zero voltage on both CS and WE instructs command decoder circuitry 34 to disable power switch circuitry 32 via read/write commands 48, and WL power level is kept negative/zero. For a write operation, a positive pulse is provided on both CS and WE, which instructs command decoder circuitry 34 to enable power switch circuitry 32 via read/write commands 48 and connect the VWL_WR signal to WL for a predetermined time. Thus, WL transitions to the same power level as VWL_WR for said predetermined time period, and a write operation 62 is performed at MTJ 36. For a read operation, a positive pulse is provided on CS while WE remains at zero/negative, which instructs command decoder circuitry 34 to enable power switch circuitry 32 via read/write commands 48 and connect VDDX to WL for a predetermined time. Thus, WL transitions to the same power level as VDDX for said predetermined time period, and a read operation 64 is performed at MTJ 36. VWL_WR is at a different power level than VDDX, and accordingly the power level on WL during a write operation is different than the power level on WL during a read operation.

FIG. 3 is a simplified schematic diagram of an MRAM word line power control scheme of the disclosed embodiment. FIG. 3 illustrates an IC 70 having a power generation module 72 and an MRAM macro 90. Power generation module 72 provides stable output voltages (e.g., VWL) to an MRAM cell 91 of MRAM macro 90 with as low a difference as possible between the input voltages and the output voltages. Power generation module 72 includes voltage input circuitry 74 and a data selector 76. Optionally, power generation module 72 may further include isolation circuitry 78. In addition to providing read/write control functions, the control signals (CS) and the write enable (WE) signals are also provided to data selector 76, which is configured to utilize CS and WE as external power control signals for power generation module 72. Using the parameters described in the present disclosure, one of ordinary skill in the relevant arts may implement data selector 76 directly in hardware, in a software module executed by a processor, or in any combination thereof. Voltage input circuitry 74 provides a first voltage level 82 and a second voltage level 84 into data selector 76. To clearly distinguish read operations from write operations, the first voltage level 82 is different from the second voltage level 84. Under control of external command signals, CS and WE, data selector 76 selects and outputs either first voltage level 82 or second voltage level 84. More specifically, under control of external read/write commands CS and WE, data selector 76 selects and outputs either first voltage level 82 if CS and WE indicate a write operation, or second voltage level 84 if CS and WE indicate a read operation. The optional isolation circuitry 78 receives a single output voltage from data selector 76 and forwards it to a WL of MRAM cell 91. The output from isolation circuitry 78 is substantially equal to its input voltage, which is received from the data selector 76. Thus, isolation circuitry 78 isolates its output signal from its input, thereby drawing very little power from the input signal source and avoiding "loading" effects. MRAM cell 91 receives the stable and isolated VWL signal via word line (WL).

FIG. 4 is a more detailed example of the disclosed embodiment illustrated in FIG. 3. As shown in FIG. 4, the power generator module 72 of FIG. 3 may be implemented as an LDO 80. Because a conventional LDO typically includes a feature that allows its output power level to be changed according to, for example, a trimming code, the LDO 80 of the disclosed embodiment can be inexpensively implemented by configuring a conventional LDO to change its power output according to the external read/write commands. The voltage input circuitry 74 may be implemented as a voltage divider having resistive elements R5, R6, R7, R8, a first node 100 and a second node 102. First node 100 produces VWL_WR, and second node 102 produces VDDX. VWL_WR and VDDX are each a fraction of the difference between the input voltage (Vio) and the negative supply or ground voltage (Vss). In order to clearly distinguish read operations from write operations, the values of resistive elements R5-R8 are chosen such that the first voltage level 100 is different from the second voltage level 102. The data selector 76 may be implemented as a multiplexer circuit 104 and a buffer 110. Buffer 110 receives external read/write command signals CS and WE and outputs a selection signal 112 to the selection input (SEL) of multiplexer circuit 104. Multiplexer circuit 104 receives VWL_WR at one input and VDDX at a second input. The multiplexer SEL input selects the VWL_WR power level and provides it on the multiplexer output if selection signal 112 indicates a write operation, and the multiplexer SEL input selects the VDDX power level and provides it on the multiplexer output if selection signal 112 indicates a read operation. Isolation circuitry 78 may be implemented as a voltage follower circuit having a first operational amplifier 106 and a second operational amplifier 108. Operational amplifier 106 receives the multiplexer output voltage (VWL) at its positive terminal (+) input, and operational amplifier 108 receives second node 102 voltage (VDDX) at its positive (+) terminal input. Each operational amplifier 106, 108 is in a voltage follower configuration such that each operational amplifier's output voltage is substantially equal to its positive terminal (+) input voltage. Thus, the voltage follower operational amplifiers 106, 108 isolate their output signals from their positive terminal input signals, thereby drawing very little power from the input signal source and avoiding "loading" effects.

Continuing with the simplified schematic diagram of FIG. 4, MRAM macro 90 includes an MRAM cell 91, an MTJ 92, a word line transistor 94, a bit line (BL), a word line (WL) and a source line (SL). MRAM macro 90 further includes command decoder circuitry 96 that receives the core power supply (VDDX) of the memory chip, control signals (CS) and write enable signals (WE) to control various operations of MRAM macro 90 including read operations and write operations. MRAM macro 90 receives the stable and isolated VWL power signal on WL. In contrast to the known MRAM 30 shown in FIG. 1, the disclosed embodiment eliminates the need to provide relatively large and expensive power switching circuitry (power switch circuitry 32, read/write commands 48 in FIG. 1) on the MRAM macro to control the power level applied to WL.

FIG. 5 is a timing diagram 120 illustrating the operation of the MRAM word line power control scheme shown in FIGS. 3 and 4. In particular, timing diagram 120 shows the behavior of MTJ 92 and certain signals (CS, WE, VWL, VDDX, WL) during write and read operations. The horizontal axis of the timing diagram 120 represents time, and the vertical axis of the timing diagram 120 represents power levels of the signals listed on the left side of the diagram. For power lines VWL and VDDX, the power levels of these signals may be actively driven at some times and not actively driven at other times. When a signal is actively driven, the signal is depicted as a solid line. When a signal is not being actively driven, it may be pulled high or low by a resistor, or may be allowed to float. Whenever a signal is not actively driven, the timing diagram depicts it as a dashed line. If the dashed line is high or low, it may be assumed that a pull up or pull down resistor is maintaining the state of that signal.

Referring now to both the timing diagram of FIG. 5 and the simplified schematic diagrams of FIGS. 3 and 4, the read/write operation of the MRAM macro 90 is controlled by CS and WE. A negative/zero voltage on both CS and WE instructs data selector 76 of power generation module 72 (or LDO 80) to pull its output voltage to a negative/zero value, thereby pulling WL power to negative or zero. For a write operation, a positive pulse is provided on both CS and WE, which instructs command decoder circuitry 96 to initiate a read operation on MRAM macro 90. The positive pulses on both CS and WE also instruct data selector 76 of power generation module 72 to pull its output voltage to the power level at first node 100, thereby pulling VWL to VWL_WR for a predetermined time. Thus, the power level of VWL on WL transitions to the same power level as VWL_WR for said predetermined time period, and concurrently a write operation 122 is performed at MTJ 92. For a read operation, a positive pulse is provided on CS while WE remains at negative/zero, which instructs command decoder circuitry 96 to initiate a read operation on MRAM macro 90. A positive pulse on CS while WE remains negative/zero also instructs data selector 76 of power generation module 72 to pull its output voltage to the power level at the second node 102, thereby pulling VWL to VDDX for a predetermined time. Thus, the power level of VWL transitions to the same power level as VDDX for said predetermined time period, and concurrently a read operation 124 is performed at MTJ 92. Note that VWL is at the first node 100 power level during write operation 122 and at the second node 102 power level, which is different than the first node 100 power level, during read operation 124.

It should be noted here that raising and lowering the power level on a single line into WL means there will be a transition time 126 to move WL from one power level to another power level. Accordingly, a wait time 128 is required between write operation 122 and read operation 124 to allow the WL power level to transition. Wait time 128 may be provided by the data selector 76 in FIG. 3, or by the buffer 110 in FIG. 4.

Thus, under the disclosed embodiment, the different word line power levels required for read/write operations are accomplished using existing external command signals and an existing power generation module, thereby eliminating the cost and die-size required to supply the different word line power levels via relatively large and expensive switching circuitry on the MRAM macro.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for controlling WL power to an MRAM. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An apparatus comprising:
a memory macro comprising a Magnetoresistive Random Access Memory (MRAM) and a command decoder; and
a power generation module configured to provide different power levels to a word line of the MRAM in response to at least one of a write command or a read command;
wherein the power generation module comprises:
a buffer configured to receive the write command and the read command and provide a wait time;
a selector coupled to the buffer and not coupled to the command decoder, the selector configured to select a first power level for the word line based on the write command or a second power level for the word line based on the read command, wherein the selector is further configured to apply the wait time between selection of the first power level and selection of the second power level; and
an isolation circuit configured to couple an output of the selector and the word line.

2. The apparatus of claim 1, wherein the selector comprises a multiplexer circuit.

3. The apparatus of claim 1 integrated in at least one semiconductor die.

4. The apparatus of claim 1, integrated into a device, selected from the group consisting of a set top box, music player, video player, entertainment unit, navigation device, communications device, personal digital assistant (PDA), fixed location data unit, and a computer.

5. The apparatus of claim 1, wherein the MRAM comprises Spin Transfer Torque MRAM.

6. The apparatus of claim 1, wherein the MRAM comprises a magnetic tunnel junction (MTJ) coupled to a word line transistor.

7. The apparatus of claim 1, wherein the first power level is higher than the second power level.

8. The apparatus of claim 1, wherein the power generation module comprises a low dropout (LDO) regulator.

9. The apparatus of claim 1, wherein the isolation circuit comprises an operational amplifier configured to receive the output of the selector at a positive terminal input of the operational amplifier and provide the different power levels to the word line at an output of the operational amplifier.

10. A method of controlling word line power to a memory macro comprising a Magnetoresistive Random Access Memory (MRAM) comprising:
receiving a write command and a read command at a command decoder provided in the memory macro;
receiving a write command and a read command at a buffer provided in a power generation module;
providing a wait time by the buffer;
controlling a selector of the power generation module for selecting a first power level for a word line of the MRAM based on the write command or a second power level for the word line based on the read command, and for applying the wait time between selecting the first power level and selecting the second power level, wherein the selector is coupled to the buffer and not coupled to the command decoder; and
coupling an output of the selector with the word line using an isolation circuit.

11. The method of claim 10, wherein the first power level is higher than said second power level.

12. The method of claim 10, wherein the power generation module comprises a low dropout (LDO) regulator.

13. The method of claim 10, wherein the MRAM comprises Spin Transfer Torque MRAM.

14. The method of claim 10, wherein the MRAM comprises a magnetic tunnel junction (MTJ) coupled to a word line transistor.

15. The method of claim 10, wherein coupling the output of the selector with the word line using the isolation circuit comprises coupling the output of the selector to a positive terminal input of an operational amplifier of the isolation circuit and coupling an output of the operational amplifier to the word line.

* * * * *